(12) United States Patent
Gu et al.

(10) Patent No.: US 7,538,040 B2
(45) Date of Patent: May 26, 2009

(54) TECHNIQUES FOR PRECISION PATTERN TRANSFER OF CARBON NANOTUBES FROM PHOTO MASK TO WAFERS

(75) Inventors: Shiqun Gu, San Diego, CA (US); Peter G. McGrath, Portland, OR (US); James Elmer, Vancouver, WA (US); Richard J. Carter, Dresden (DE); Thomas Rueckes, Rockport, MA (US)

(73) Assignee: Nantero, Inc., Woburn, MA (US)

( * ) Notice: Subject to any disclaimer, the term of this patent is extended or adjusted under 35 U.S.C. 154(b) by 128 days.

(21) Appl. No.: 11/298,274

(22) Filed: Dec. 8, 2005

(65) Prior Publication Data
US 2007/0004191 A1 Jan. 4, 2007

Related U.S. Application Data

(60) Provisional application No. 60/696,336, filed on Jun. 30, 2005.

(51) Int. Cl.
*H01L 21/461* (2006.01)
(52) U.S. Cl. ............... 438/717; 438/734; 257/E21.023; 257/E21.029; 977/742
(58) Field of Classification Search .................. 438/717, 438/743; 257/E21.023, E21.029; 977/742
See application file for complete search history.

(56) References Cited

U.S. PATENT DOCUMENTS

| 4,979,149 A | 12/1990 | Popovic et al. |
|---|---|---|
| 6,057,637 A | 5/2000 | Zettl et al. |
| 6,100,109 A | 8/2000 | Melzner et al. |
| 6,128,214 A | 10/2000 | Kuekes et al. |
| 6,250,984 B1 | 6/2001 | Jin et al. |
| 6,256,767 B1 | 7/2001 | Kuekes et al. |

(Continued)

FOREIGN PATENT DOCUMENTS

GB 2 364 933 A 2/2002

(Continued)

OTHER PUBLICATIONS

Ajayan, P. M. et al., "Applications of Carbon Nanotubes", Carbon Nanotubes, vol. 80, pp. 391-425, 2001.

(Continued)

*Primary Examiner*—Trung Dang
(74) *Attorney, Agent, or Firm*—Wilmer Cutler Pickering Hale and Dorr LLP

(57) ABSTRACT

A method for patterning CNTs on a wafer wherein a CNT layer is provided on a substrate, a hard mask film is deposited on the CNT layer, a BARC layer (optional) is coated on the hard mask film, and a resist is patterned on the BARC layer (or directly on the hard mask film if the BARC layer is not included). Then, the resist pattern is effectively transferred to the hard mask film by etching the BARC layer (if provided) and etching partly into, but not entirely through, the hard mask film (i.e., etching is stopped before reaching the CNT layer) Then, the resist and the BARC layer (if provided) is stripped, and the hard mask pattern is effectively transferred to the CNTs by etching away (preferably by using Cl, F plasma) the portions of the hard mask which have been already partially etched away.

15 Claims, 5 Drawing Sheets

U.S. PATENT DOCUMENTS

| | | | |
|---|---|---|---|
| 6,277,318 B1 | 8/2001 | Bower et al. | |
| 6,314,019 B1 | 11/2001 | Kuekes et al. | |
| 6,342,276 B1 | 1/2002 | You | |
| 6,409,567 B1 | 6/2002 | Amey, Jr. et al. | |
| 6,423,583 B1 | 7/2002 | Avouris et al. | |
| 6,426,687 B1 | 7/2002 | Osborn | |
| 6,443,901 B1 | 9/2002 | Fraser | |
| 6,445,006 B1 | 9/2002 | Brandes et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,548,841 B2 | 4/2003 | Frazier et al. | |
| 6,630,772 B1 | 10/2003 | Bower et al. | |
| 6,645,628 B2 | 11/2003 | Shiffler, Jr. et al. | |
| 6,707,098 B2 | 3/2004 | Hofmann et al. | |
| 6,803,840 B2 | 10/2004 | Kowalcyk et al. | |
| 6,808,746 B1 | 10/2004 | Dai et al. | |
| 6,809,462 B2 | 10/2004 | Pelrine et al. | |
| 6,833,558 B2 | 12/2004 | Lee et al. | |
| 6,858,197 B1 | 2/2005 | Delzeit | |
| 6,863,942 B2 | 3/2005 | Ren et al. | |
| 6,899,945 B2 | 5/2005 | Smalley et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,946,410 B2 | 9/2005 | French et al. | |
| 6,955,937 B1 | 10/2005 | Burke et al. | |
| 6,969,651 B1 | 11/2005 | Lu et al. | |
| 6,990,009 B2 | 1/2006 | Bertin et al. | |
| 6,995,046 B2 | 2/2006 | Rueckes et al. | |
| 7,057,402 B2 | 6/2006 | Cole et al. | |
| 7,160,169 B2* | 1/2007 | Park | 445/51 |
| 7,161,285 B2* | 1/2007 | Okamoto et al. | 313/311 |
| 7,217,374 B2* | 5/2007 | Watanabe et al. | 252/502 |
| 7,329,931 B2 | 2/2008 | Bertin | |
| 7,339,401 B2 | 3/2008 | Bertin et al. | |
| 7,416,993 B2 | 8/2008 | Segal et al. | |
| 2001/0004979 A1 | 6/2001 | Han et al. | |
| 2002/0160111 A1 | 10/2002 | Sun et al. | |
| 2003/0004058 A1 | 1/2003 | Li et al. | |
| 2003/0122111 A1 | 7/2003 | Glatkowski | |
| 2003/0177450 A1 | 9/2003 | Nugent | |
| 2003/0200521 A1 | 10/2003 | DeHon et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0041154 A1 | 3/2004 | Watanabe et al. | |
| 2004/0043219 A1* | 3/2004 | Ito et al. | 424/408 |
| 2004/0043527 A1 | 3/2004 | Bradley et al. | |
| 2004/0071949 A1 | 4/2004 | Glatkowski et al. | |
| 2004/0099438 A1 | 5/2004 | Arthur et al. | |
| 2004/0104129 A1 | 6/2004 | Gu et al. | |
| 2004/0238907 A1 | 12/2004 | Pinkerton et al. | |
| 2004/0253167 A1 | 12/2004 | Silva et al. | |
| 2004/0265550 A1 | 12/2004 | Glatkowski et al. | |
| 2005/0047244 A1 | 3/2005 | Rueckes et al. | |
| 2005/0052894 A1 | 3/2005 | Segal et al. | |
| 2005/0053525 A1 | 3/2005 | Segal et al. | |
| 2005/0056825 A1 | 3/2005 | Bertin et al. | |
| 2005/0056866 A1 | 3/2005 | Bertin et al. | |
| 2005/0056877 A1 | 3/2005 | Rueckes et al. | |
| 2005/0058590 A1 | 3/2005 | Sen et al. | |
| 2005/0058797 A1 | 3/2005 | Sen et al. | |
| 2005/0058834 A1 | 3/2005 | Rueckes et al. | |
| 2005/0059176 A1 | 3/2005 | Rueckes et al. | |
| 2005/0059210 A1 | 3/2005 | Rueckes et al. | |
| 2005/0062035 A1 | 3/2005 | Bertin et al. | |
| 2005/0062062 A1 | 3/2005 | Bertin et al. | |
| 2005/0062070 A1 | 3/2005 | Bertin et al. | |
| 2005/0063210 A1 | 3/2005 | Segal et al. | |
| 2005/0063244 A1 | 3/2005 | Bertin et al. | |
| 2005/0065741 A1 | 3/2005 | Segal et al. | |
| 2005/0068128 A1 | 3/2005 | Yip | |
| 2005/0074926 A1 | 4/2005 | Bertin et al. | |
| 2005/0095938 A1 | 5/2005 | Rosenberger et al. | |
| 2005/0101112 A1 | 5/2005 | Rueckes et al. | |
| 2005/0128788 A1 | 6/2005 | Segal et al. | |
| 2005/0174842 A1 | 8/2005 | Bertin et al. | |
| 2005/0184294 A1* | 8/2005 | Zhang | 257/77 |
| 2005/0191495 A1 | 9/2005 | Rueckes et al. | |
| 2005/0214195 A1* | 9/2005 | Jung et al. | 423/445 B |
| 2005/0237781 A1 | 10/2005 | Bertin et al. | |
| 2005/0266605 A1* | 12/2005 | Kawakami | 438/99 |
| 2005/0269553 A1 | 12/2005 | Sen et al. | |
| 2005/0269554 A1 | 12/2005 | Sen et al. | |
| 2005/0272342 A1* | 12/2005 | Chen et al. | 445/50 |
| 2005/0282516 A1 | 12/2005 | Bertin | |
| 2006/0044035 A1 | 3/2006 | Bertin | |
| 2006/0061389 A1 | 3/2006 | Bertin | |
| 2006/0125033 A1 | 6/2006 | Segal et al. | |
| 2006/0128049 A1 | 6/2006 | Jaiprakash et al. | |
| 2006/0183278 A1 | 8/2006 | Bertin et al. | |
| 2006/0193093 A1 | 8/2006 | Bertin et al. | |
| 2006/0204427 A1 | 9/2006 | Ghenciu et al. | |
| 2006/0231865 A1 | 10/2006 | Rueckes et al. | |
| 2006/0237799 A1 | 10/2006 | Lu et al. | |
| 2006/0237805 A1 | 10/2006 | Segal et al. | |
| 2006/0250843 A1 | 11/2006 | Bertin et al. | |
| 2006/0250856 A1 | 11/2006 | Bertin et al. | |
| 2006/0255834 A1 | 11/2006 | Bertin | |
| 2006/0276056 A1 | 12/2006 | Ward et al. | |
| 2006/0278902 A1 | 12/2006 | Sun et al. | |
| 2007/0004191 A1 | 1/2007 | Gu et al. | |
| 2007/0018260 A1 | 1/2007 | Jaiprakash et al. | |
| 2007/0020859 A1 | 1/2007 | Bertin et al. | |
| 2007/0030721 A1 | 2/2007 | Segal et al. | |
| 2007/0063740 A1 | 3/2007 | Bertin et al. | |
| 2007/0108482 A1 | 5/2007 | Bertin et al. | |
| 2007/0248758 A1* | 10/2007 | Ward et al. | 427/271 |
| 2008/0186756 A1 | 8/2008 | Bertin et al. | |
| 2008/0191742 A1 | 8/2008 | Bertin | |
| 2008/0231413 A1 | 9/2008 | Bertin et al. | |
| 2008/0251723 A1 | 10/2008 | Ward et al. | |

FOREIGN PATENT DOCUMENTS

| | | |
|---|---|---|
| GB | 2364933 | 2/2002 |
| JP | 2000203821 | 7/2000 |
| JP | 2001-035362 A2 | 2/2001 |
| JP | 2004-090208 A2 | 3/2004 |
| WO | WO-98/39250 | 9/1998 |
| WO | WO-99/65821 A1 | 12/1999 |
| WO | WO-00/48195 | 8/2000 |
| WO | WO-01/03208 | 1/2001 |
| WO | WO-03/034142 | 10/2001 |
| WO | WO-02/48701 A2 | 6/2002 |
| WO | WO-03/016901 A1 | 2/2003 |

OTHER PUBLICATIONS

Avouris, P., et al., "Carbon Nanotube Electronics," Chemical Physics, 2002, vol. 284, pp. 429-445.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Bradley, K. et al., "Flexible Nanotube Electronics," *Nano Letters*, vol. 3, No. 10, pp. 1353-1355, 2003.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Dai, H. et al., "Controlled Chemical Routes to Nanotube Artchitectures, Physics, and Devices", J. Phys. Chem. B, vol. 103, pp. 1126-11255, 1999.

Dequesnes, M. et al., "Calculation of pull-in voltages for carbon-nanotube-based nanoelectromechanical switches," *Nanotechnology*, Jan. 22, 2002, vol. 13, pp. 383-386.

Desai et al., "Freestanding Carbon Nanotube Specific Fabrication", *Proc of 2005, 5th IEEE Conf., Nanotech*, Nagoya, Japan, pp. 1-4, Jul. 2005.

Franklin, N. R. et al., "An Enhance CVD Approach to Extensive Nanotube Networks with Directionality", Advanced Materials, 5 pages, 2000.

Hafner, J. H. et al., "Catalytic growth of single-wall carbon nanotubes from metal particles", Chemical Physics Letters, vol. 296, pp. 195-202, Oct. 30, 1998.

Homma, Y. et al., "Single Walled Carbon Nanotube Growth on Silicon Substrates Using Nanoparticle Catalysts", Jpn. J. Appl. Phys., vol., 41, Pt. 2, No. 1A/B, pp. L89-91, 2002.

Joselevich, E., "Vectorial Growth of Metallic and Semiconducting Single-Wall Carbon Nanotubes", Nano Letters, vol. 0, No. 0, A-E, 2002.

Kaneto et al., "Electrical conductivites of multi-wall carbon nano tubes", *Synthethic Materials*, Elsevier Science, SA., vol. 203, pp. 2543-2546, 1999.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Li, J. et al., "Cabon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13, pp. 1008-1014, 2001.

Nerushev, O.A., et al., "Carbon nanotube films obtained by thermal chemical vapour deposition", J. Mater. Chem. vol. 11, pp. 1122-1132, 2001.

Onoa, G.B. et al., "Bulk production of singly dispersed carbon nanotube with prescribed lengths," Nanotechnology, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Sotiropoulou, S. et al., "Carbon nanotube array-based biosensor", Anal. Bioanal. Chem, vol. 375, pp. 103-105, 2003.

Stadermann, M. et al., "Nanoscale study of conduction through carbon nanotube networks," *Phys. Rev. B 69*, 201402(R), 2004.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Zhang et al., "Formation of metal nanowires on suspened signel-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al., "Select Pathways to Carbon Nanotube Film Growth", Advanced Materials, 4 pages, Jun. 19, 2001.

Zhao, Y. P. et al., Frequency-dependent electrical transport in carbor nanotubes', Physical Review B., vol. 64, pp. 201402-1 to 201402-4, 2001.

Ago et al., "Work Function of PUrified and Oxidised Carbon Nanotubes," Synthetic Metals, vol. 103, pp. 2494-2495 (1999).

Banerjee et al., "Functionalization of Carbon Nanotubes with a Metal-Containing Molecular Complex," Nano Letters, vol. 2, No. 1, pp. 49-53 (2002).

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Delzeit et al., "Mulilayered Metal Catalysts for Controlling the Density of Single-Walled Carbon Nanotubes Growth," Chemical Physics Letters, vol. 348, pp. 368-374, Nov. 16, 2001.

Haddon et al., "Purification and Separation of Carbon Nanotubes," MRS Bulletin, pp. 252-259, Apr. 2004.

International Search Report for PCT/U2005/045316, Sep. 6, 2006, 2 pages.

International Search Report and Written Opinion for International Patent Application No. PCT/US05/18467, Oct. 1, 2007.

International Search Report, International Patent Application No. PCT/US05/18539, Sep. 18, 2006, 4 pages.

Jeong et al., "A New Purification Method of Single-Wall Carbon Nanotubes Using H2S and O2 Mixutre Gas," chemical Physics Letters, vol. 344, pp. 18-22, Aug. 17, 2001.

\* cited by examiner

TECHNIQUES FOR PRECISION PATTERN TRANSFER OF CARBON NANOTUBES FROM PHOTO MASK TO WAFERS

RELATED APPLICATION (PRIORITY CLAIM)

This application claims the benefit of U.S. Provisional Application Ser. No. 60/696,336, filed Jun. 30, 2005, which is hereby incorporated herein by reference in its entirety.

BACKGROUND

The present invention generally relates to carbon nanotubes, and more specifically relates to a technique for precisely transferring a carbon nanotube pattern from a photomask to a wafer.

Carbon nanotube technology is fast becoming a technological area to make an impact in electronic devices. Single-wall carbon nanotubes (CNTs) are quasi-one dimensional nanowires, which exhibit either metallic of semiconducting properties, depending upon their chirality and radius. Single-wall nanotubes have been demonstrated as both semiconducting layers in thin film transistors as well as metallic interconnects between metal layers.

Currently, there are two approaches which are being used to pattern CNTs (i.e., to transfer a carbon nanotube pattern from a photomask to a wafer):

FIGS. 1-3 illustrate a first method which is currently used. In each one of FIGS. 1-3, a top view is provided on the left, and a side view is provided on the right. In the method, as shown in FIG. 1, initially a CNT layer 10 is provided on a substrate 12 and a resist 14 is patterned on the CNT layer 10. Then, as shown in FIG. 2, $O_2$ plasma is used to etch the CNTs 10 (i.e., from the locations identified by reference numeral 16). Then, as shown in FIG. 3, the resist is stripped using wet chemistry.

Disadvantages of this method include the fact that the $O_2$ plasma tends to lateral etch both the CNTs and resist. Where the resist lateral dimension reduces, the final CNTs pattern line width also decreases as indicated in the progression of FIG. 1 to FIG. 2, wherein the width of both the CNTs and the resist has decreased (despite the fact that the plasma etching was intended to merely etch any CNT which was not covered by the resist). Actually, the higher the pressure of the $O_2$ plasma, the more dimension loss there tends to be. In addition, it is usually difficult to use wet strip chemistry to strip the organic antireflective layer (i.e., the resist). Therefore, resist patterning often remains on the (CNTs), and this may lead to high reflectance for the pattern light, and poor profile for the resist patterns. All this results in difficult control of the critical dimension of the CNT pattern.

FIGS. 4-6 illustrate a first method which is currently used. In each one of FIGS. 4-6, a top view is provided on the left, and a side view is provided on the right. In the method, as shown in FIG. 4, initially a CNT layer 10 is provided on a substrate 12, a hard mask layer 13 is provided on the CNT layer 10, and a resist 14 is patterned on the hard mask layer 13. Then, as shown in FIG. 5, the hard mask 13 and the CNT layer 10 is etched away (i.e., those portions which are not covered by the resist—identified with reference numeral 16 in FIG. 5). Finally, as shown in FIG. 6, the resist is ashed away using $O_2$ plasma.

Disadvantages of this method include the fact that after the hard mask and CNT layers are etched, the $O_2$ plasma which is used to ash the resist attacks the CNTs from the hard mask sidewall (i.e., the plasma undercuts the hard mask and attacks the CNTs underneath). This results in a resulting, physical CNT pattern which is narrower than that of the design.

OBJECTS AND SUMMARY

An object of an embodiment of the present invention is to provide an improved technique for transferring a carbon nanotube pattern to a wafer.

Another object of an embodiment of the present invention is to provide a method for patterning CNTs on a wafer where the CNTs do not become exposed to high $O_2$ plasma during patterning.

Still another object of an embodiment of the present invention is to provide a method for patterning CNTs on a wafer where the critical dimension of the CNTs are maintained.

Briefly, and in accordance with at least one of the foregoing objects, an embodiment of the present invention provides a method for patterning CNTs on a wafer wherein a CNT layer is provided on a substrate, a hard mask film is deposited on the CNT layer, a BARC layer (optional) is coated on the hard mask film, and a resist is patterned on the BARC layer (or directly on the hard mask film if the BARC layer is not included). Then, the resist pattern is effectively transferred to the hard mask film by etching the BARC layer (if provided) and etching partly into, but not entirely through, the hard mask film (i.e., etching is stopped before reaching the CNT layer) Then, the resist and the BARC layer (if provided) is stripped, such as by using $O_2$ plasma. Finally, the hard mask pattern is effectively transferred to the CNTs by etching away (preferably by using a Cl, F based plasma) the portions of the hard mask which have been already partially etched in a previous step.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
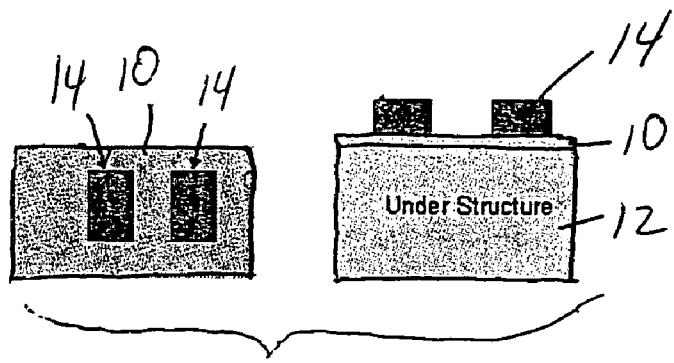
FIGS. 1-3 are views which relate to a currently used method of patterning CNTs on a wafer.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 2:
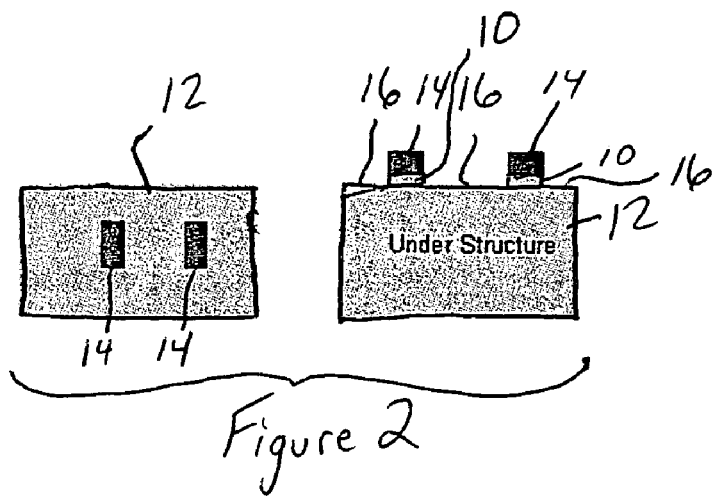
Figure 3:
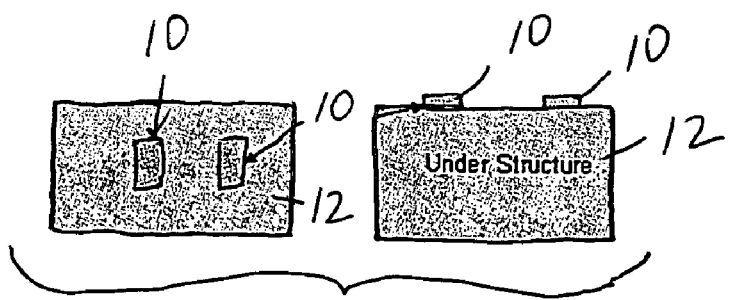
Figure 4:
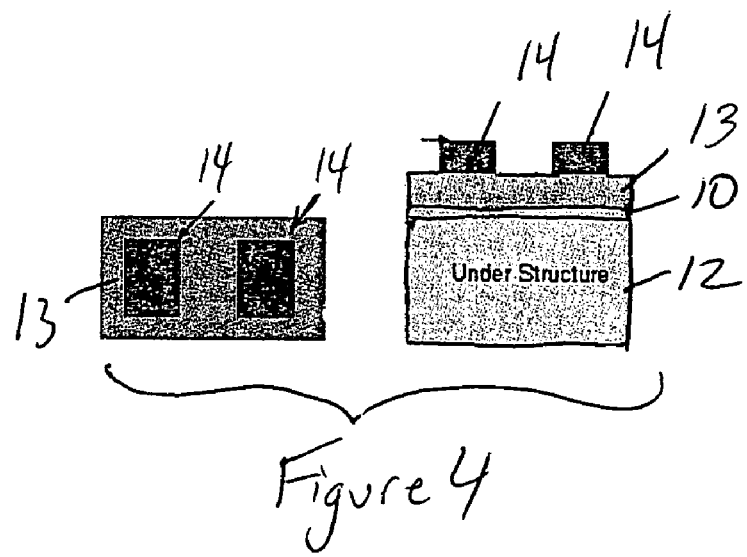
FIGS. 4-6 are views which relate to another currently used method of patterning CNTs on a wafer.
Figure 5:
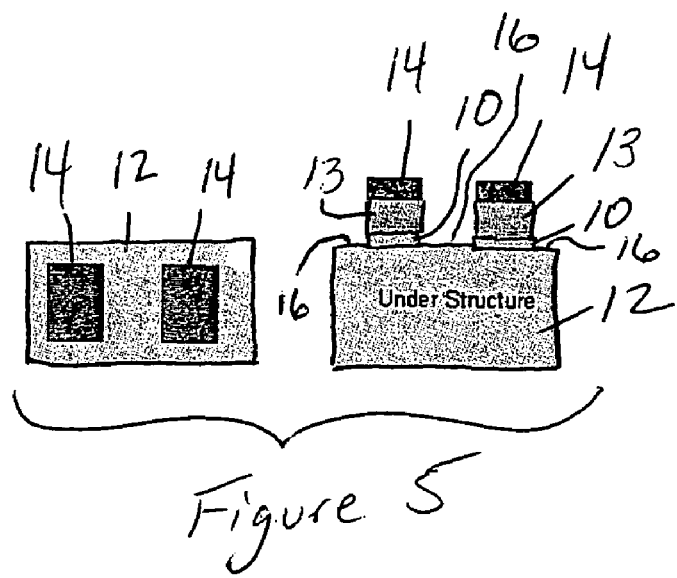
Figure 6:
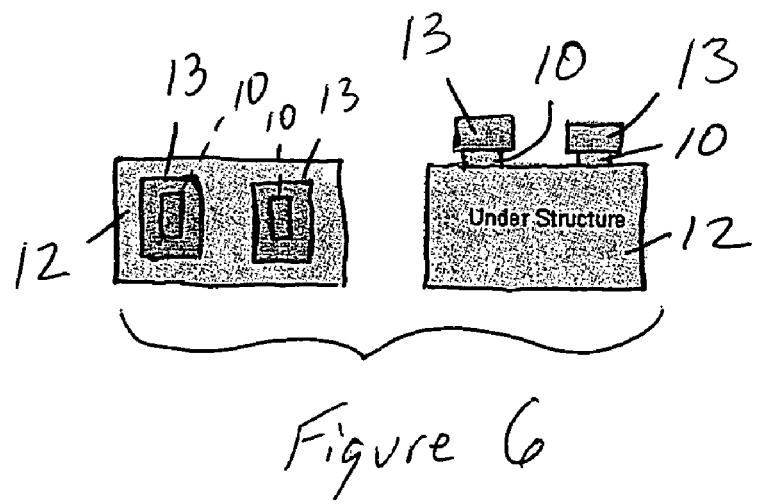

As described above in connection with FIGS. 1 and 2, $O_2$ plasma typically not only etches CNTs but also attacks the resist. Hence, it is desirable to minimize exposure of CNTs to $O_2$ plasma during patterning. A method which is in accordance with an embodiment of the present invention is illustrated in FIG. 7(a), and FIGS. 8-11 provides views which relate to the method shown in FIG. 7(a). In each one of FIGS. 8-11, a top view is provided on the left, and a side view is provided on the right.

Figure 7A:
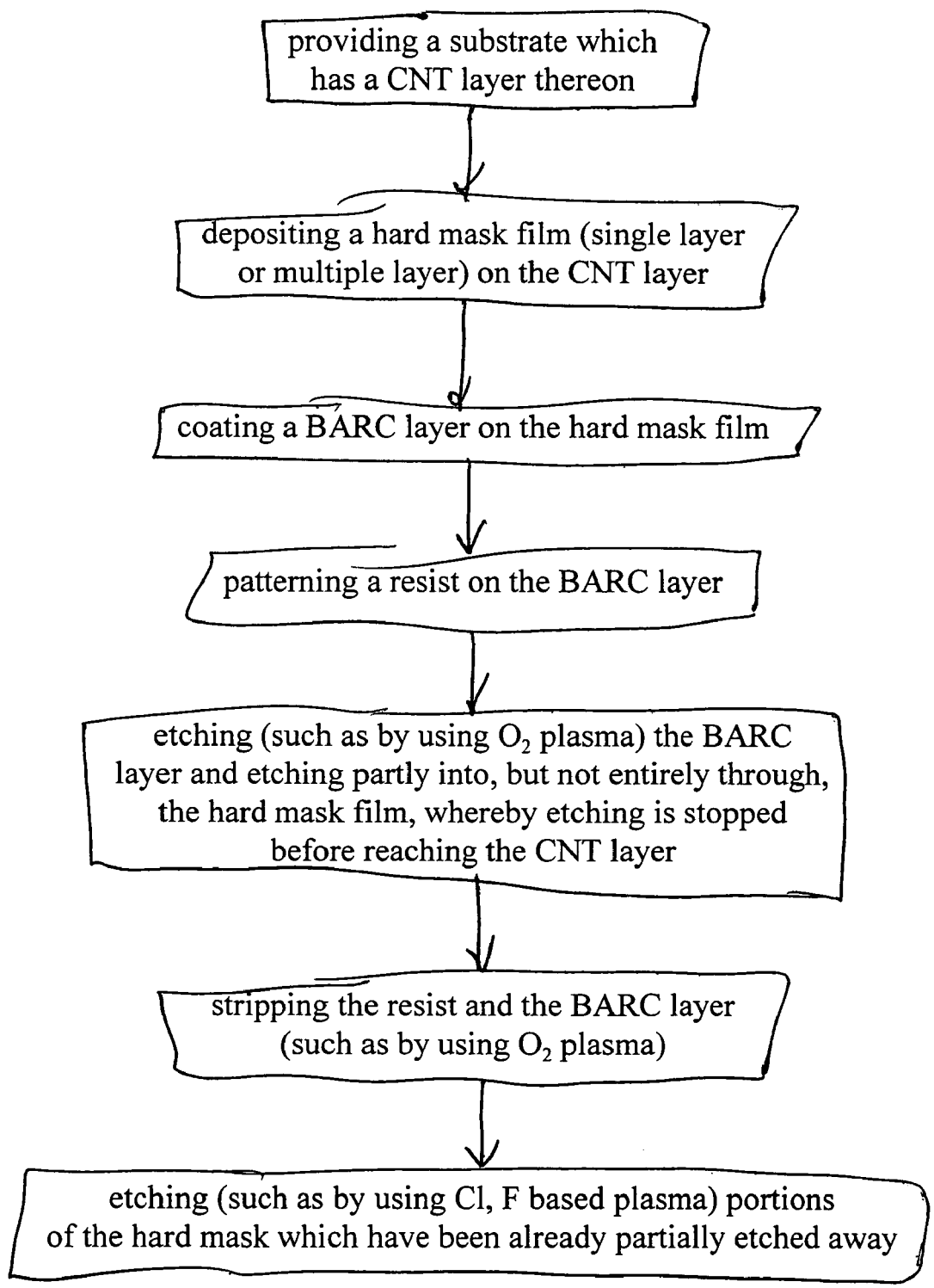
FIGS. 7(a) and 7(b) are block diagram which set forth the steps of methods of patterning CNTs on a wafer, where the methods are in accordance with embodiments of the present invention.
Figure 8:
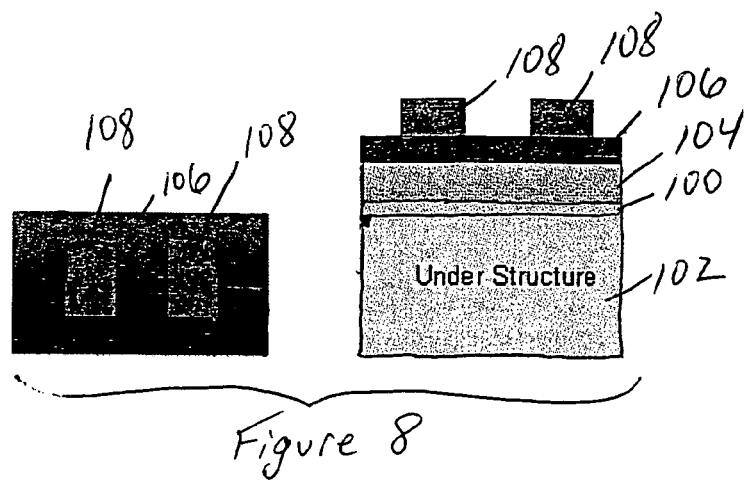
FIGS. 8-11 are views which relate to the method illustrated in FIG. 7(a).
Figure 9:
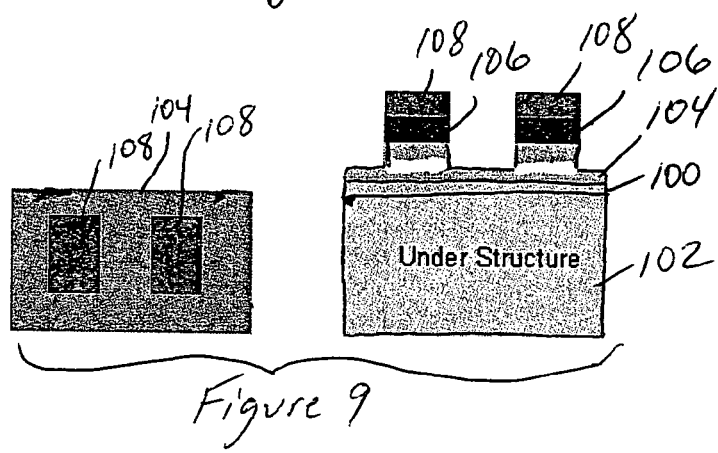
Figure 10:
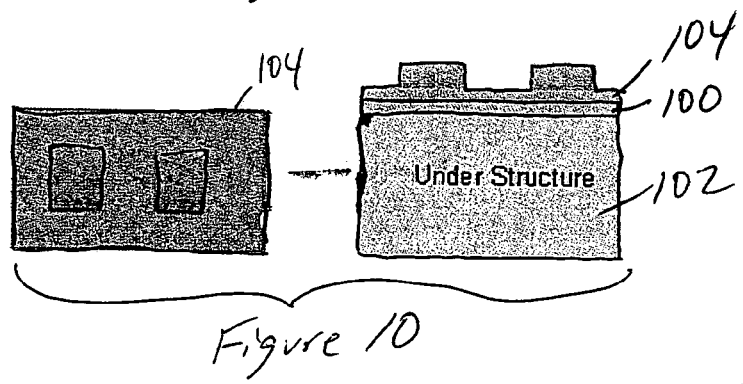
Figure 11:
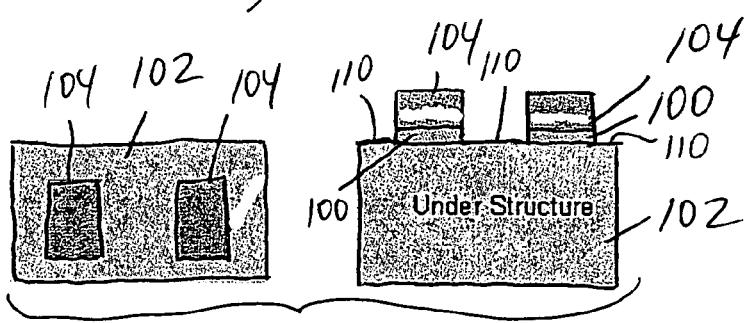

As shown in FIGS. 7(a) and 8, the method provides that initially a CNT layer 100 is provided on a substrate 102, a hard mask film 104 (the hard mask film 104 could be binary to improve the etch control) is deposited on the CNT layer 100, a BARC layer 106 (optional) is coated on the hard mask film 104, and a resist 108 is patterned on the BARC layer 106 (or directly on the hard mask film if the BARC layer is not included). Then, as shown in FIGS. 7(a) and 9, the resist pattern is effectively transferred to the hard mask film 104 by etching the BARC layer 106 (if provided) (such as by using $O_2$ plasma or other plasma such as Cl, F) and etching partly into, but not entirely through, the hard mask film 104 (i.e., etching is stopped before reaching the CNT layer 100). While a binary hard mask layer will make the etch a little easier, it is not required. Then, as shown in FIGS. 7(a) and 10, the resist 108 and the BARC layer 106 (if provided) are stripped, such as by using $O_2$ plasma. Finally, as shown in FIGS. 7(a) and 11, the hard mask pattern is effectively transferred to the CNTs by etching away (preferably by using a highly directional plasma, such as a Cl, F based plasma) the portions of the hard mask 104 which have been already partially etched in a previous step (i.e., from the areas identified with reference numeral 110). With regard to the hard mask, either a dual layer hard mask can be used wherein only a top layer of the hard mask is initially etched away, or a single layer hard mask can be used but where the etching stops before the CNTs are reached.

Figure 7B:
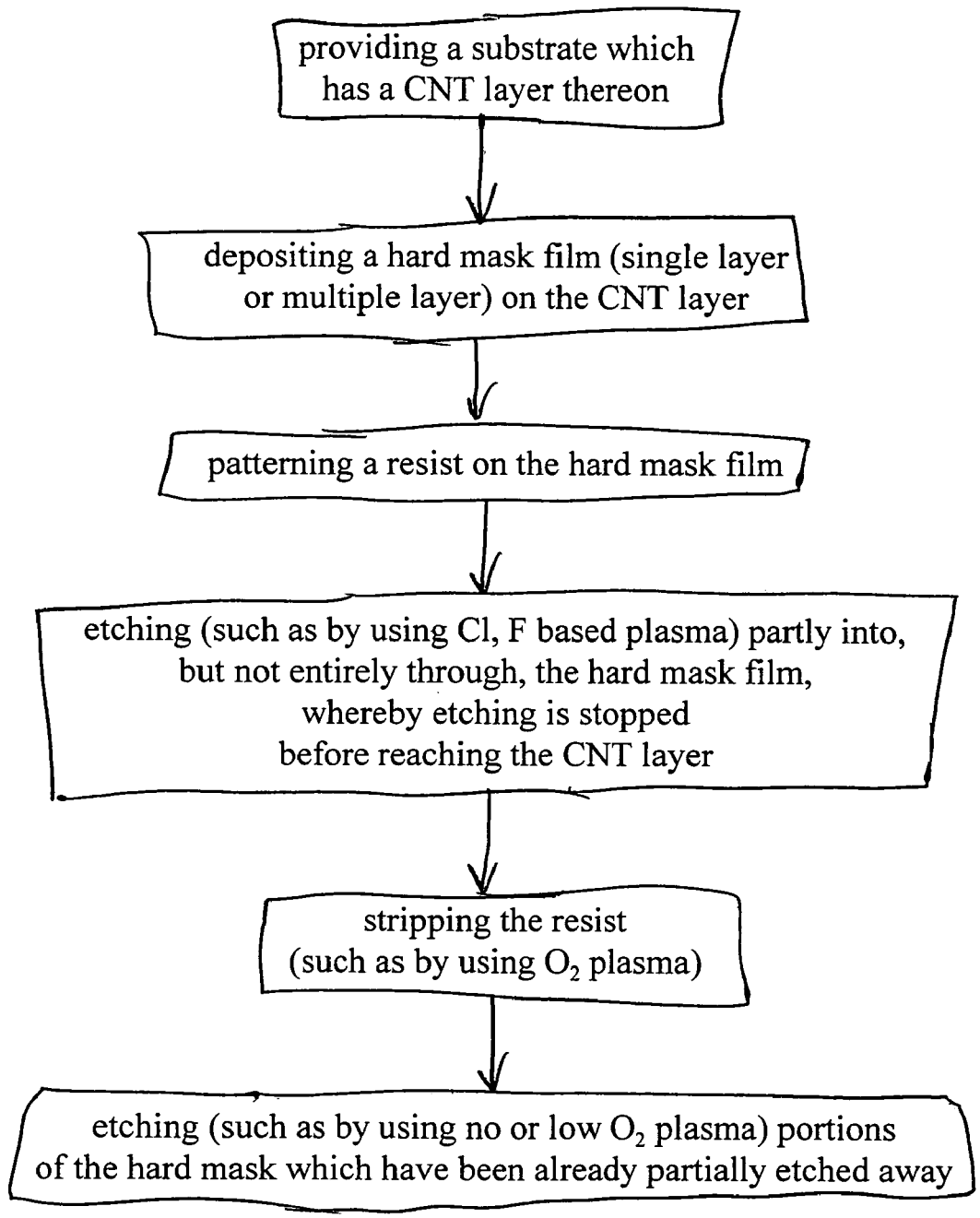

As mentioned above, the BARC layer is optional. FIG. 7(b) illustrates effectively the same method but where the BARC layer is not included.

Advantages of the present invention include the fact that the CNTs are not exposed to $O_2$ plasma during patterning, a BARC layer can be used for the photomask step, and the critical dimension is maintained from the resist pattern to the CNT patterns. The present invention can be applied to any application which needs pattern CNTs.

While embodiments of the present invention are shown and described, it is envisioned that those skilled in the art may devise various modifications of the present invention without departing from the spirit and scope of the appended claims.

What is claimed is:

1. A method of patterning CNTs on a substrate comprising:
   providing the substrate, wherein the substrate has a CNT layer thereon;
   depositing a hard mask film on the CNT layer;
   coating a BARC layer on the hard mask film;
   patterning a resist on the BARC layer;
   etching the BARC layer;
   etching partly into, but not entirely through, the hard mask film, whereby etching is stopped before reaching the CNT layer;
   stripping the resist and the BARC layer; and
   etching away portions of the hard mask which have been already partially etched away.

2. A method as recited in claim 1, wherein the step of etching the BARC layer comprises using $O_2$ plasma or other plasma such as Cl, F.

3. A method as recited in claim 1, wherein the step of etching partly into, but not entirely through, the hard mask film, comprises using F or Cl based plasma.

4. A method as recited in claim 1, wherein the step of stripping the resist and the BARC layer comprises using $O_2$ plasma.

5. A method as recited in claim 1, wherein the step of etching away portions of the hard mask which have been already partially etched away comprises using no $O_2$ plasma.

6. A method as recited in claim 1, wherein the step of etching away portions of the hard mask which have been already partially etched away comprises using low $O_2$ plasma.

7. A method as recited in claim 1, wherein the step of depositing a hard mask film on the CNT layer comprises depositing a single layer hard mask, and wherein said step of etching partly into, but not entirely through, the hard mask film comprises etching away less than all of a thickness of said single layer.

8. A method as recited in claim 1, wherein the step of depositing a hard mask film on the CNT layer comprises depositing a multiple layer hard mask, and wherein said step of etching partly into, but not entirely through, the hard mask film comprises etching away less than all the layers of the hard mask film.

9. A method of patterning CNTs on a substrate comprising:
   providing the substrate, wherein the substrate has a CNT layer thereon;
   depositing a hard mask film on the CNT layer;
   patterning a resist on the CNT layer;
   etching partly into, but not entirely through, the hard mask film, whereby etching is stopped before reaching the CNT layer;
   stripping the resist; and
   etching away portions of the hard mask which have been already partially etched away.

10. A method as recited in claim 9, wherein the step of etching partly into, but not entirely through, the hard mask film, comprises using F or Cl-based plasma.

11. A method as recited in claim 9, wherein the step of stripping the resist and comprises using $O_2$ plasma.

12. A method as recited in claim 9, wherein the step of etching away portions of the hard mask which have been already partially etched away comprises using no $O_2$ plasma.

13. A method as recited in claim 9, wherein the step of etching away portions of the hard mask which have been already partially etched away comprises using low $O_2$ plasma.

14. A method as recited in claim 9, wherein the step of depositing a hard mask film on the CNT layer comprises depositing a single layer hard mask, and wherein said step of etching partly into, but not entirely through, the hard mask film comprises etching away less than all of a thickness of said single layer.

15. A method as recited in claim 9, wherein the step of depositing a hard mask film on the CNT layer comprises depositing a multiple layer hard mask, and wherein said step of etching partly into, but not entirely through, the hard mask film comprises etching away less than all the layers of the hard mask film.

* * * * *